(12) United States Patent
Hayata

(10) Patent No.: US 8,760,342 B2
(45) Date of Patent: Jun. 24, 2014

(54) CIRCUIT BOARD, HIGH FREQUENCY MODULE, AND RADAR APPARATUS

(75) Inventor: Kazuki Hayata, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 308 days.

(21) Appl. No.: 13/259,126

(22) PCT Filed: Mar. 31, 2010

(86) PCT No.: PCT/JP2010/055972
§ 371 (c)(1),
(2), (4) Date: Sep. 22, 2011

(87) PCT Pub. No.: WO2010/114079
PCT Pub. Date: Oct. 7, 2010

(65) Prior Publication Data
US 2012/0013499 A1   Jan. 19, 2012

(30) Foreign Application Priority Data
Mar. 31, 2009 (JP) ................................ 2009-088204

(51) Int. Cl.
*G01S 13/00* (2006.01)
(52) U.S. Cl.
USPC .............................. 342/175; 342/104; 342/70
(58) Field of Classification Search
CPC ...................................................... H01P 3/085
USPC ..................................... 342/70, 175; 333/238
See application file for complete search history.

(56) References Cited

U.S. PATENT DOCUMENTS

| 6,515,562 B1* | 2/2003 | Takenoshita et al. .......... 333/248 |
| 2007/0040735 A1* | 2/2007 | Matsuo et al. ................. 342/175 |
| 2009/0079648 A1* | 3/2009 | Matsuo et al. ................. 343/771 |
| 2010/0188281 A1 | 7/2010 | Hayata et al. .................. 342/118 |

(Continued)

FOREIGN PATENT DOCUMENTS

| DE | 19918567 A1 | 3/2000 |
| EP | 2 178 151 A1 | 4/2010 |

(Continued)

OTHER PUBLICATIONS

Japanese language International Preliminary Report on Patentability dated Oct. 13, 2011 and its English language translation for corresponding PCT application PCT/2010/055972.

(Continued)

*Primary Examiner* — John B Sotomayor
*Assistant Examiner* — Marcus Windrich
(74) *Attorney, Agent, or Firm* — DLA Piper LLP (US)

(57) ABSTRACT

A circuit board is provided. The circuit board includes a substrate, a waveguide line and a laminated waveguide. The waveguide line is at least partially positioned on a first surface of the substrate. The waveguide line transmits a high frequency signal. The laminated waveguide is formed inside the substrate. The laminated waveguide is electromagnetically coupled to the waveguide line, and has a lead-out portion led out from inside the substrate to a surface other than the first surface. The laminated waveguide includes a dielectric layer, a pair of main conductive layers and a through conductor group. The pair of main conductive layers sandwiches the dielectric layer in a thickness direction thereof. In the through conductor group, a plurality of through conductors are arranged along a high frequency signal transmitting direction. The plurality of through conductors electrically connect the pair of main conductive layers.

9 Claims, 12 Drawing Sheets

(56) References Cited

U.S. PATENT DOCUMENTS

| | | | |
|---|---|---|---|
| 2010/0245155 A1* | 9/2010 | Miyazato et al. | 342/104 |
| 2011/0187482 A1 | 8/2011 | Ohno et al. | 333/254 |
| 2012/0013421 A1* | 1/2012 | Hayata | 333/239 |

FOREIGN PATENT DOCUMENTS

| | | |
|---|---|---|
| JP | 11-074701 | 3/1999 |
| JP | 11-097854 | 4/1999 |
| JP | 2004-254068 | 9/2004 |
| JP | 2008-271295 | 11/2008 |
| WO | WO 2008/152852 A1 | 12/2008 |
| WO | WO 2009/017203 A1 | 2/2009 |
| WO | WO 2009/084697 A1 | 7/2009 |
| WO | WO 2010013721 A1 * | 2/2010 ............ H01P 5/18 |

OTHER PUBLICATIONS

Korean language office action dated Mar. 8, 2013 and an English concise explanation issued in corresponding Korean application 20117022898.

German language office action dated Jun. 3, 2013 and its English language translation issued in corresponding German application 112010001453.1 cites the U.S. patent application publications and foreign patent document listed above.

Japanese language office action dated Jun. 4, 2013 and its English language Statement of Relevance of Non-English References pursuant to 37 CFR 1-98(a)(3)(i) issued in corresponding Japanese application 2011507282.

* cited by examiner

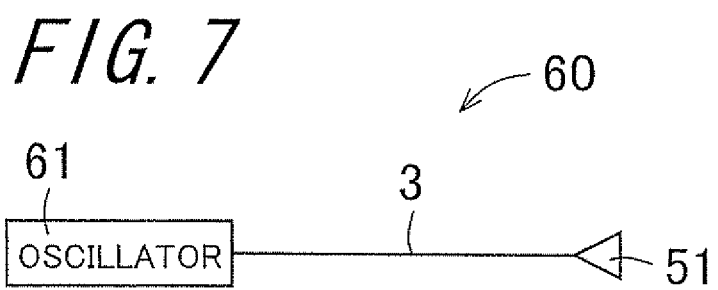

CIRCUIT BOARD, HIGH FREQUENCY MODULE, AND RADAR APPARATUS

CROSS-REFERENCE TO THE RELATED APPLICATIONS

The present application is a national stage of international application No. PCT/JP2010/055972, filed on Mar. 31, 2010, and claims the benefit of priority under 35 USC 119 to Japanese. Patent Application No. 2009-088204, filed on Mar. 31, 2009, the entire contents of which are incorporated herein by reference.

TECHNICAL FIELD

The present invention relates to a circuit board, a high frequency module, and a radar apparatus.

BACKGROUND ART

There are proposed systems to which communication techniques are applied that use high frequency signals in a high frequency region such as a microwave region at 1 to 30 GHz or a millimeter wave region at 30 to 300 GHz. Examples of such systems include data communication systems and radar systems.

Some high frequency circuits that use high frequency signals have a circuit configuration in which a high frequency element such as a MMIC (monolithic microwave integrated circuit) is mounted on a circuit board having a waveguide line such as a microstrip line. On the high frequency element mounting surface, not only the waveguide line but also various element circuits used for the system are formed. These element circuits and high frequency signals radiated through the waveguide line may be affected by each other. Thus, an antenna board having an antenna may be disposed on a back surface of the circuit board. There is a technique for directly connecting the circuit board and the antenna board via a solder bump. This technique is described, for example, in Japanese Unexamined Patent Publication JP-A 2004-254068.

In the high frequency module described in JP-A 2004-254068, an input-output port of a circuit board and an input-output port of an antenna board are arranged on mutually opposing surfaces of the boards. In such a high frequency module, in the case where a plurality of openings of waveguides are formed, the size of the circuit board increases.

An object of the invention is to provide a circuit board whose size can be reduced, a high frequency module and a radar apparatus.

SUMMARY OF INVENTION

A circuit board of the invention comprises a substrate having a plurality of surfaces, a waveguide line, and a laminated waveguide. The waveguide line is at least partially positioned on a first surface of the substrate. The waveguide line transmits a high frequency signal. The laminated waveguide is formed inside the substrate. The laminated waveguide is electromagnetically coupled to the waveguide line, and has a lead-out portion led out from inside the substrate to a surface other than the first surface. The laminated waveguide comprises a dielectrics, a pair of main conductive layers between which the dielectrics is sandwiched, and a through conductor group. In the through conductor group, a plurality of through conductors are arranged along a signal transmitting direction. The plurality of through conductors electrically connect the pair of main conductive layers. According to the invention, it is possible to provide a circuit board whose size is reduced.

A high frequency module and a radar apparatus of the invention include the above-described circuit board. According to the invention, it is possible to provide a high frequency module and a radar apparatus whose size is reduced.

BRIEF DESCRIPTION OF DRAWINGS

FIG. 7 is a view showing the configuration of a transmitter 60 according to an embodiment of the invention;

DESCRIPTION OF EMBODIMENT

Hereinafter, preferred embodiments of the invention will be described in detail with reference to the drawings.

Figure 1:
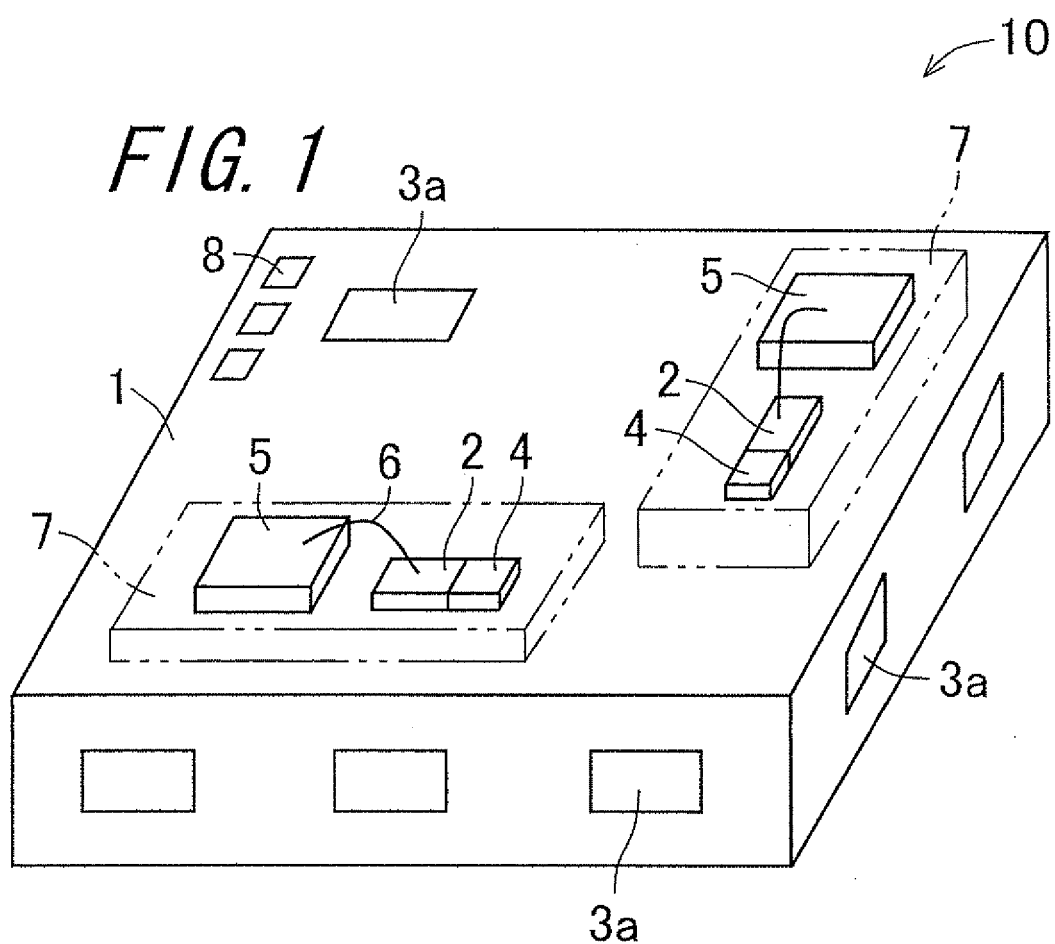
FIG. 1 is a perspective view showing the configuration of a circuit board 10 according to an embodiment of the invention.
Figure 2:
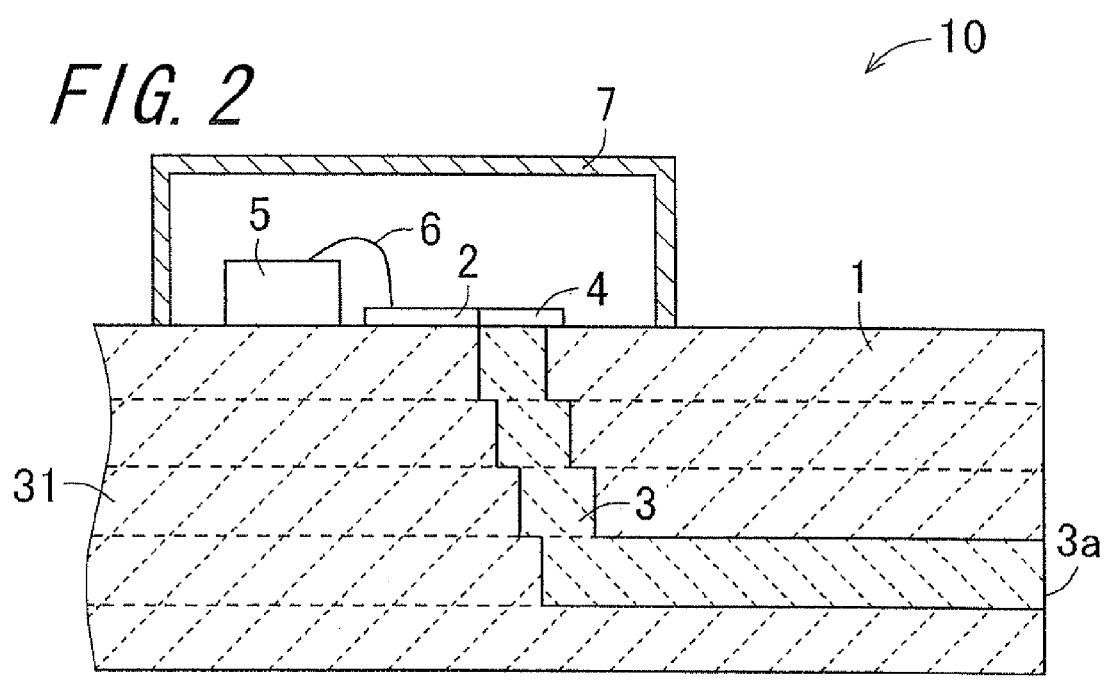
FIG. 2 is a cross-sectional view showing the configuration of the circuit board 10.

A circuit board 10 shown in FIGS. 1 and 2 includes a substrate 1 that has a plurality of surfaces, a plurality of waveguide lines 2, and a plurality of laminated waveguides 3 that are formed inside the substrate 1. The circuit board 10 has a high frequency circuit configured such that the plurality of waveguide lines 2 and the plurality of laminated waveguides 3 are electromagnetically coupled to each other. The substrate 1 is a portion that configured to be a base material in the circuit board 10. In the circuit board 10, the waveguide lines 2 and the laminated waveguides 3 form a high frequency circuit, and, thus, the tolerance for deviation in placement can be wider than in the case where the waveguide lines 2 and resonators are connected to each other. Examples of this deviation in placement include displacement between layers in the circuit board 10 and displacement between the circuit board 10 and a second circuit board 51 (described later).

Here, in the circuit board 10 of this embodiment, a plurality of waveguide lines 2 and a plurality of laminated waveguides 3 are arranged, but the number of waveguide lines 2 and the number of laminated waveguides 3 may be one.

The waveguide lines 2 are at least partially positioned on a first surface of the substrate 1. Among lines that transmit a high frequency signal, the waveguide lines 2 are to transmit a high frequency signal to a conductor. Examples of the high frequency signal include signals in high frequency regions such as a microwave region at 1 to 30 GHz and a millimeter wave region at 30 to 300 GHz. The waveguide lines 2 may be, for example, microstrip lines, coplanar lines, and strip lines (triplate lines). It is preferable to use microstrip lines.

Figure 3A:
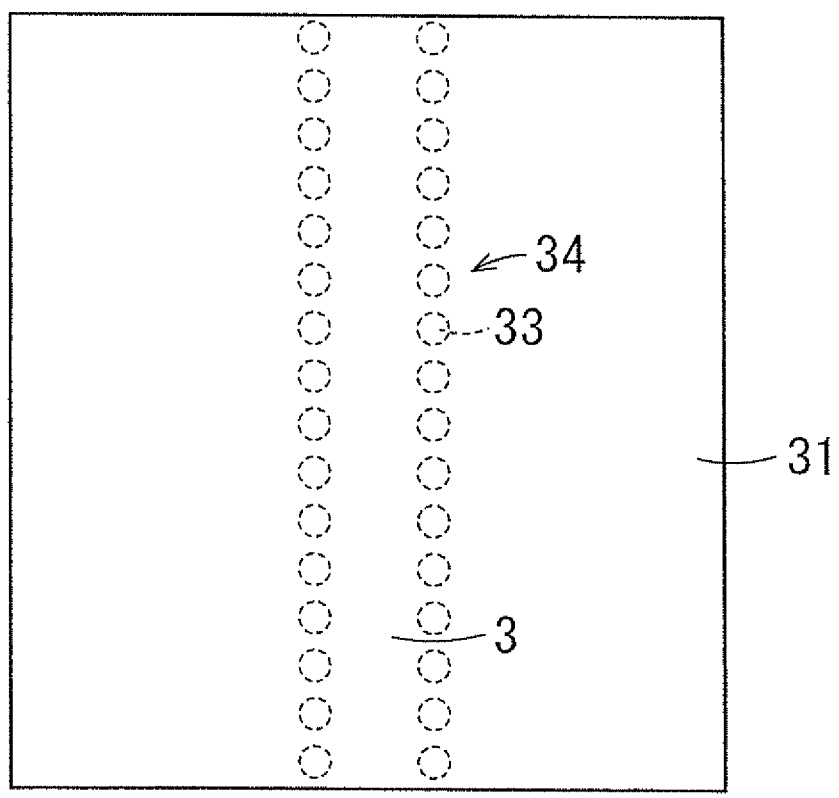
FIG. 3A is a plan view showing the configuration of a laminated waveguide 3.
Figure 3B:
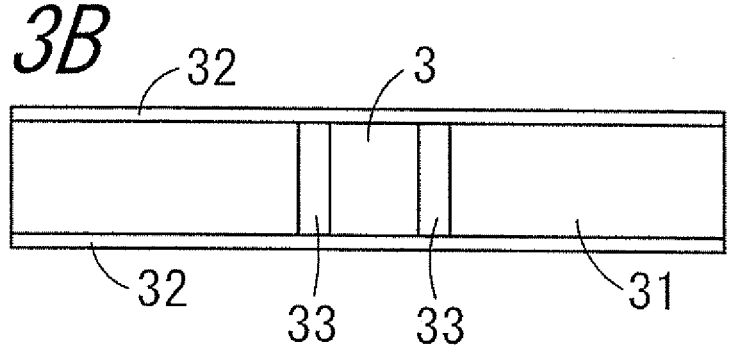
FIG. 3B is a side view showing from the high frequency signal transmitting direction in the laminated waveguide 3.

The laminated waveguide 3 shown in FIGS. 3A and 3B includes a dielectric layer 31, a pair of main conductive layers 32, and a through conductor group 34. The pair of main conductive layers 32 sandwich the dielectric layer 31 therebetween in a thickness direction thereof, and are opposed to each other in the thickness direction thereof. The through conductor group 34 includes a plurality of through conductors 33 that electrically connect the pair of main conductive layers 32 in the thickness direction thereof. The plurality of through conductors 33 are arranged in two lines along the high frequency signal transmitting direction. More specifically, in the laminated waveguide 3, the dielectric layer 31 is surrounded by the pair of main conductive layers 32 and the through conductor group 34 that electrically connects the main conductive layers 32. Among lines that transmit a high frequency signal, the laminated waveguides 3 are to transmit a high frequency signal to a dielectrics.

In the through conductor group 34, in the case where the interval at which the through conductors 33 are arranged along the high frequency signal transmitting direction is smaller than half a wavelength of the high frequency signal, electromagnetic waves are reflected and propagated in the high frequency signal transmitting direction in the laminated waveguide 3 without leaking through a gap between through conductors. The through conductors 33 arranged in line are set such that, in each line, the interval between adjacent through conductors 33 is substantially constant. The through conductors 33 are arranged at an interval that is smaller than half the wavelength of a high frequency signal that is to be transmitted. An interval may be appropriately set as long as the interval is smaller than the half.

The dielectric layer 31 of this embodiment is made of ceramics in view of precision in forming a transmission line and easiness in the production.

Such a dielectric layer 31 is produced, for example, in the following processes. First, organic solvents and organic flux are added to and mixed with a ceramic raw material powder to form a slurry. Examples of ceramics include glass ceramics, alumina ceramics, and aluminum nitride ceramics. Next, this slurry is shaped into sheets, and, thus, a plurality of ceramic green sheets are obtained. The method for shaping a slurry into sheets may be, for example, a doctor blade method and a calender roll method. Next, these ceramic green sheets are punched to form through-holes. These through-holes are filled with a conductive paste to form the through conductor group 34. In addition, various conductor patterns are printed on the ceramic green sheets. The ceramic green sheets thus processed are laminated. The laminated ceramic green sheets are fired to form a dielectrics. The firing temperature is 850 to 1000° C. for glass ceramics, 1500 to 1700° C. for alumina ceramics, and 1600 to 1900° C. for aluminum nitride ceramics.

Here, the dielectric layer 31 also may be made of a resin material. Examples of a resin material that can be used for the dielectric layer 31 include a liquid crystal polymer, a fluorocarbon resin, and a fluorocarbon resin or epoxy resin having a glass base material. In particular, the epoxy resin having a glass base material is preferably an FR4 (Flame Retardant Type 4) epoxy resin. Further, a mixed material in which a resin is mixed with ceramics can be used. A metal conductor in this case may be formed, for example, by patterning a bonded copper foil or copper plating film. Examples of the patterning include etching.

A resin substrate is used as the dielectric layer 31, and the internal surfaces of the through-holes are plated with copper to form through conductors or conductors are embedded in the through-holes to form embedded conductors, and, thus, a through conductor group is formed. An opening of a coupling portion is formed at a predetermined position on the resin substrate using various methods with a drill, a laser, etching, or otherwise. The resin substrates on which various conductor patterns are formed are stacked on and bonded to each other to form a high frequency substrate.

Furthermore, the main conductive layers 32 connected by the through conductor group 34 are preferably made of the following conductive pastes according to the material of the dielectric layer 31. In the case where the dielectric layer 31 is made of alumina ceramics, for example, a conductive paste is used in which an oxide, organic solvents, organic flux, and the like are added to and mixed with a metal powder of tungsten, molybdenum, or the like. Examples of the oxide include alumina, silica, and magnesia. Furthermore, in the case of glass ceramics, the metal powder is preferably copper, gold, or silver, for example. Furthermore, in the case of alumina ceramics and aluminum nitride ceramics, the metal powder is preferably tungsten or molybdenum, for example. These conductive pastes are printed on the dielectric layer 31 using a thick film printing method or the like. After the printing process, a firing process is performed at a high temperature of approximately 1600° C. This printing process is performed such that the thickness after the firing process is approximately 5 to 50 μm.

In the circuit board 10, the plurality of laminated waveguides 3 are respectively led out to different surfaces of the substrate 1. Accordingly, lead-out portions 3a of the laminated waveguides 3 are formed, on surfaces of the substrate 1. The lead-out portions 3a function as ports for performing at least either one of outputting and inputting of a high frequency signal. That is to say, the lead-out portion 3a may only output a high frequency signal, may only input a high frequency signal, or may output and input a high frequency signal. In this manner, in the circuit board 10, the lead-out portions 3a of the laminated waveguides 3 are formed on different main surfaces of the substrate 1. This circuit board 10 enables connection on multiple surfaces unlike the case in which ports of a plurality of waveguides are formed on the same surface of a circuit board. In the case where connection on multiple surfaces is possible, the size of this circuit board 10 can be reduced.

In the circuit board 10 of this embodiment, the plurality of laminated waveguides 3 are respectively extended to different outer side surfaces of the substrate 1. That is to say, the lead-out portions 3a are formed on a plurality of outer side surfaces of the substrate 1. In the case where the lead-out portions 3a are formed on different outer side surfaces of the substrate 1 in this manner, the size of the circuit board 10 can be further reduced.

Furthermore, high frequency elements are mounted on one surface of the substrate 1 in the thickness direction thereof (hereinafter, referred to as a "main surface"), and the circuit board 10 mounting the high frequency elements thereon functions as a high frequency module. In this embodiment, semiconductor elements 5 are used as the high frequency elements. The semiconductor elements 5 may be, for example, monolithic microwave integrated circuits (MMIC). The semiconductor elements 5 perform at least either one of outputting and inputting of a high frequency signal. That is to say, the semiconductor element 5 may only output a high frequency signal, may only input a high frequency signal, or may output and input a high frequency signal. The semiconductor elements 5 are configured so as to be electromagnetically coupled to the waveguide lines 2, respectively.

Furthermore, in the circuit board 10 of this embodiment, couplers 4 are formed on the main surface of the substrate 1. The couplers 4 function as coupling portions that electromagnetically couple the waveguide line 2 and the laminated waveguide 3. That is to say, a high frequency signal transmitted through the waveguide line 2 is inputted via the converter 4 to the laminated waveguide 3. Furthermore, a high frequency signal transmitted through the laminated waveguide 3 is inputted via the converting portion 4 to the waveguide line 2.

Here, in the circuit board 10, an electronic element may be mounted on the main surface of the substrate 1. Examples of the electronic element include an active element and a passive element. Examples of the active element and the passive element include a capacitor, a resistor, an inductor, a high frequency LRC network, various sensors, a Zener diode, and a semiconductor element having a logic circuit. The capacitor and the Zener diode preferably support EDS. These passive elements may be elements in the form of chips or may be directly formed on the surface. In the circuit board 10, the plurality of laminated waveguides 3 are respectively led out to different outer side surfaces of the substrate 1, and, thus, the mounting area for an electronic element on the main surface of the substrate 1 can be increased.

The semiconductor element 5 and the waveguide line 2 are electrically connected to each other via a bonding wire 6. In the case where the semiconductor element 5 is an output element, a high frequency signal outputted from the semiconductor element 5 is transmitted through the bonding wire 6 and inputted to the waveguide line 2. In the case where the semiconductor element 5 is a receiving element, a high frequency signal outputted from the waveguide line 2 is transmitted through the bonding wire 6 and inputted to the semiconductor element 5. Here, the connection between the semiconductor element 5 and the waveguide line 2 is not limited to connection via the bonding wire 6. The semiconductor element 5 and the waveguide line 2 may be connected to each other by means of flip-chip bonding via conductive bumps.

Furthermore, in the circuit board 10, sealing structures 7 are arranged on the main surface side of the substrate 1. The sealing structure 7 covers the semiconductor element 5 and the coupler 4 on the main surface side of the substrate 1. The sealing structure 7 protects the semiconductor element 5 and the coupler 4. This protection may be protection against at least one of temperature, moisture, and mechanical damage. The sealing structures 7 are made of a conductive material. In this embodiment, examples of the conductive material include a metal material such as aluminum. In the case where the sealing structures 7 that cover the semiconductor elements 5 are made of a metal material in this manner, heat generated by the semiconductor elements 5 can be dissipated outside. When heat of the semiconductor elements 5 can be thus dissipated, the semiconductor elements 5 can operate with properties that are close to those originally designed.

Here, in the case where the sealing structure 7 covers a large circuit board, a resonance phenomenon may occur in an internal space of the sealing structure 7. When a resonance phenomenon occurs in the internal space of the sealing structure 7, the high frequency circuit in the internal space may not exert the originally designed properties. In the case where the MMIC has an oscillating function, a signal resulting from the oscillation and a signal resulting from the resonance may interfere with each other to cause problems such as output power reduction. Moreover, in the circuit board 10, a part of high frequency signals is radiated from the waveguide line 2 to the internal space of the sealing structure 7. The radiated high frequency signals contributes to an undesired resonance phenomenon in the internal space of the sealing structure 7.

Meanwhile, the circuit board 10 of this embodiment is a board whose size can be reduced. Accordingly, in the circuit board 10, the occurrence of resonance phenomena in the internal space of the sealing structure 7 can be reduced, and the semiconductor elements 5 can operate with properties that are close to those originally designed.

Furthermore, in the circuit board 10, control signal pads 8 are arranged on the main surface of the substrate 1. The control signal pads 8 have electrical connection with a second circuit board 51 provided in a high frequency module 50 described later.

Figure 4A:
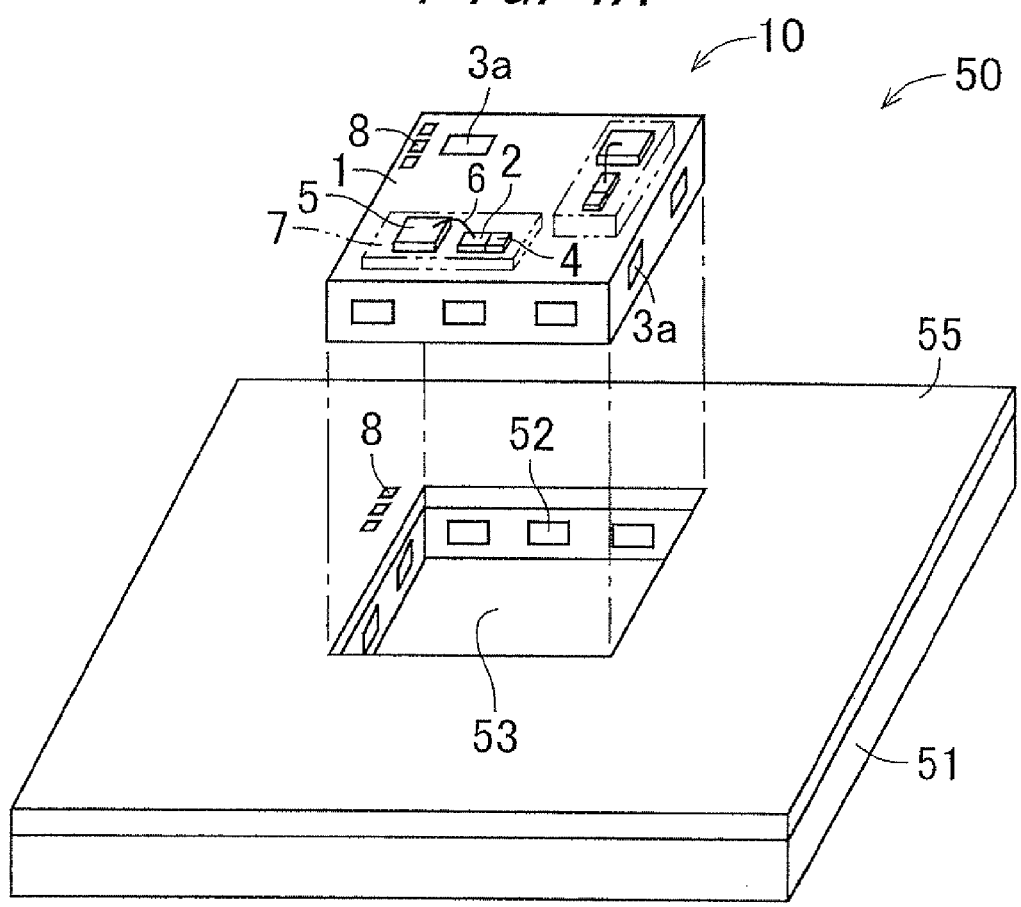
FIG. 4A is an exploded perspective view showing the configuration of a high frequency module 50 according to an embodiment of the invention.
Figure 4B:
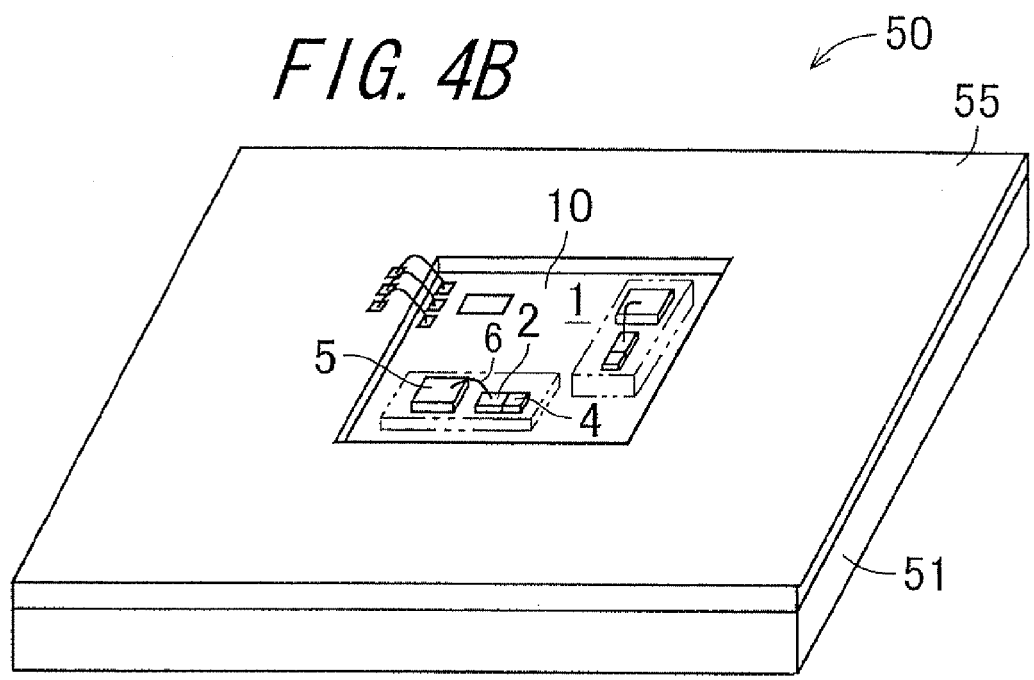
FIG. 4B is a perspective view showing the overall configuration of the high frequency module 50.

Next, the high frequency module 50 provided with the circuit board 10 will be described with reference to FIGS. 4A and 4B. The high frequency module 50 includes the circuit board 10 on which the semiconductor elements 5 are mounted and a second circuit board 51. The circuit board 10 and the second circuit board 51 are combined to form a waveguide structure. Inside the second circuit board 51, a plurality of waveguides 51a are formed as waveguides for transmitting high frequency signals. In this embodiment, a part of the plurality of waveguides 51a functions as an antenna. Such a second circuit board 51 functions as the second circuit board 51 in this embodiment. The circuit board 10, which is one of constituent components of the high frequency module 50, is a board whose size can be reduced, and, thus, the size of the high frequency module 50 also can be reduced.

The second circuit board 51 provided in the high frequency module 50 has a recess portion 53 that is recessed in a thickness direction thereof. In the second circuit board 51, the waveguides 51a are led out to inner side surfaces of the recess portion 53. Accordingly, second lead-out portions 52 are formed on surfaces of the second circuit board 51. The lead-out portions 3a of the laminated waveguides 3 formed in the circuit board 10 are fitted to the recess portion 53 of the second circuit board 51 so as to be opposed to the second lead-out portions 52 of the waveguides 51a. Accordingly, the laminated waveguides 3 and the waveguides 51a are electromagnetically coupled to each other. Accordingly, the thickness of the high frequency module 50 can be made smaller than in the case where the circuit board 10 is disposed on a surface of the second circuit board 51. Since the circuit board 10 is fitted to the recess portion 53 of the second circuit board 51, good alignment is achieved between the lead-out portions 3a formed on the circuit board 10 and the second lead-out portions 52 of the second circuit board 51. Moreover, since the circuit board 10 is fitted to the recess portion 53 of the second circuit board 51, heat generated by the circuit board 10 can be transferred from the side surfaces and a bottom surface of the circuit board 10 to the second circuit board 51, and, thus, good heat dissipation can be obtained.

In order to transmit a high frequency signal between the laminated waveguide 3 and the waveguide 51a, an electric field component of the high frequency signal for the lead-out portion 3a may be caused to match that for the second lead-out portion 52. Accordingly, a high frequency signal transmitted through the laminated waveguide 3 in TE10 mode can be effectively coupled to the second lead-out portion 52 of the waveguide 51a. At that time, better transmission of the high frequency signal can be realized by making the opening shape of the lead-out portion 3a substantially the same as that of the second lead-out portion 52 or by making the lead-out portion 3a and the second lead-out portion 52 in contact with each other.

In this embodiment, the waveguide 51a is used as a waveguide of the second circuit board 51, but there is no limitation to this. Examples of the waveguide of the second circuit board 51 include not only the waveguide but also a laminated waveguide, a waveguide line, and a coaxial line.

In the case where an output element that outputs a high frequency signal is used as the semiconductor element 5 mounted on the substrate 1 of the circuit board 10, in this high frequency module 50, first, a high frequency signal is outputted from the semiconductor element 5. The high frequency signal outputted from the semiconductor element 5 is transmitted through the laminated waveguide 3. The high frequency signal transmitted through the laminated waveguide 3 is transmitted from the lead-out portion 3a via the second lead-out portion 52 to the waveguide of the second circuit board 51. The high frequency signal transmitted to the waveguide of the second circuit board 51 is radiated from the second circuit board 51.

Furthermore, in the case where an input element that inputs a high frequency signal is used as the semiconductor element 5, a high frequency signal received by the antenna of the second circuit board 51 is first transmitted through the waveguide 51a of the second circuit board 51. Next, the high frequency signal transmitted through the waveguide 51a is transmitted from the second lead-out portion 52 via the lead-out portion 3a to the laminated waveguide 3. The high frequency signal transmitted to the laminated waveguide 3 is inputted to the semiconductor element 5.

Furthermore, the second circuit board 51 of the high frequency module 50 is further provided with a control board 55. The control board 55 controls the operation of the high frequency module 50. The control board 55 controls the semiconductor element 5 to output or receive a high frequency signal. The control board 55 and the circuit board 10 are electrically connected to each other via the control signal pads 8, and the second circuit board 51 and the circuit board 10 are connected to each other.

Figure 5:
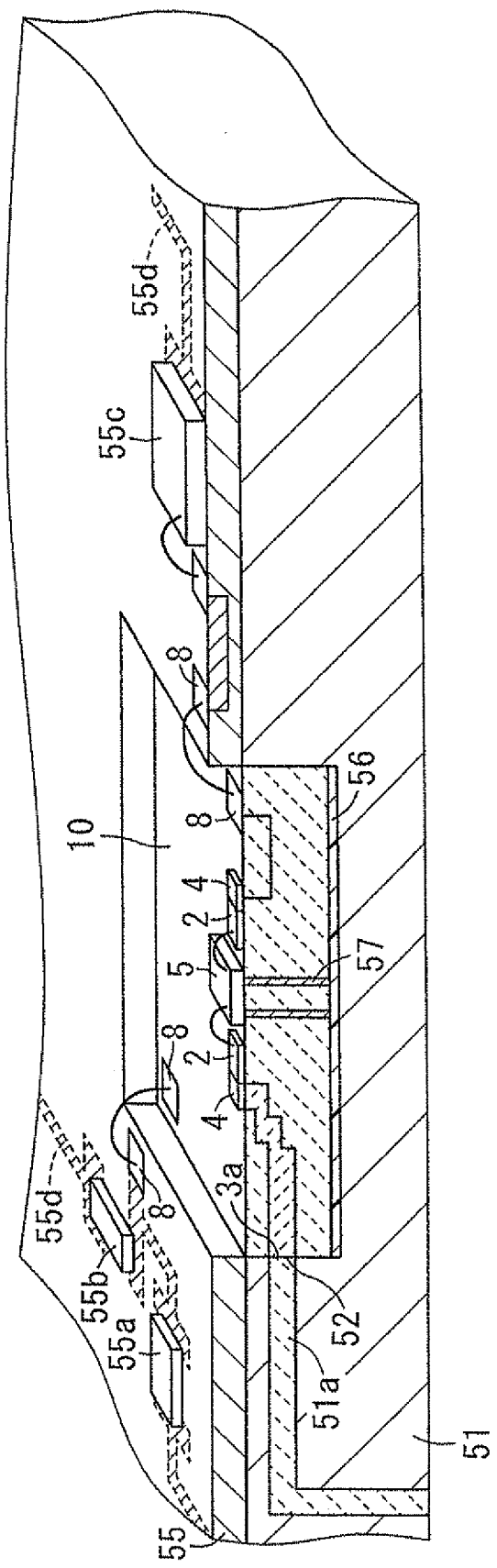
FIG. 5 is a view showing the connection structure between the boards in the high frequency module 50.

The connection structure between the circuit board 10, the second circuit board 51, and the control board 55 in the high frequency module 50 will be described with reference to FIG. 5. FIG. 5 is a view showing the connection structure between the boards in the high frequency module 50.

On a surface of the control board 55 electrically connected via the control signal pads 8 to the circuit board 10, for example, a chip resistor 55a, a chip capacitor 55b, and a signal processing IC/control IC 55c are mounted. A signal line 55d used for a control signal of the signal processing IC/control IC 55c is formed inside the control board 55.

Furthermore, the circuit board 10 is bonded via a conductive adhesive layer 56 to a bottom surface of the recess portion 53 of the second circuit board 51. A thermal-via 57 is formed inside the circuit board 10. The thermal-via 57 transfers heat generated by the circuit board 10 toward the second circuit board 51. The heat generated by the circuit board 10 is transferred via the adhesive layer 56 to the second circuit board 51. In this embodiment, a conductive layer having a high heat dissipation is used as the adhesive layer 56.

The waveguide 51a of the second circuit board 51 may be led out to the outer side surface of the second circuit board 51, or may be led out to the back surface of the second circuit board 51. In this embodiment, the waveguide 51a is configured so as to be led out to the back surface of the second circuit board 51.

Figure 6A:
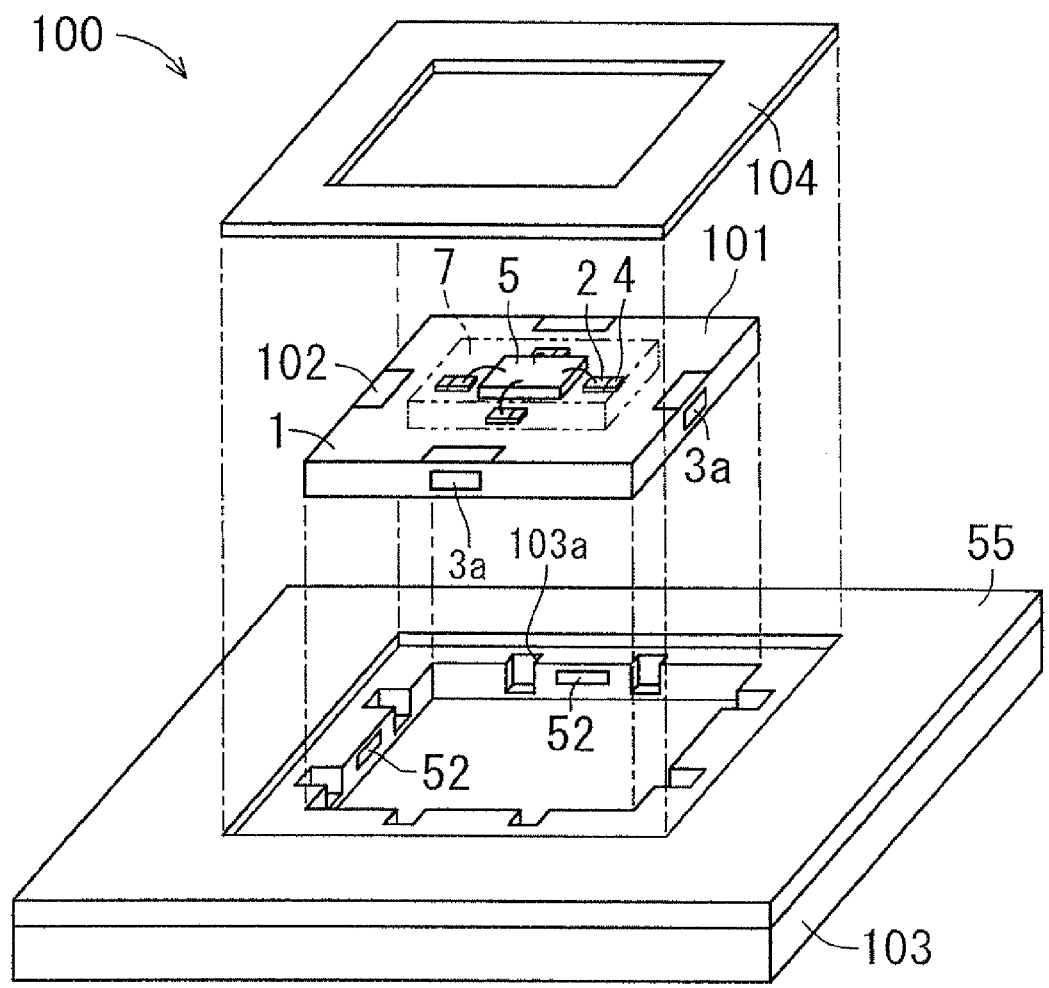
FIG. 6A is an exploded perspective view showing the configuration of a high frequency module 100 according to an embodiment of the invention.
Figure 6B:
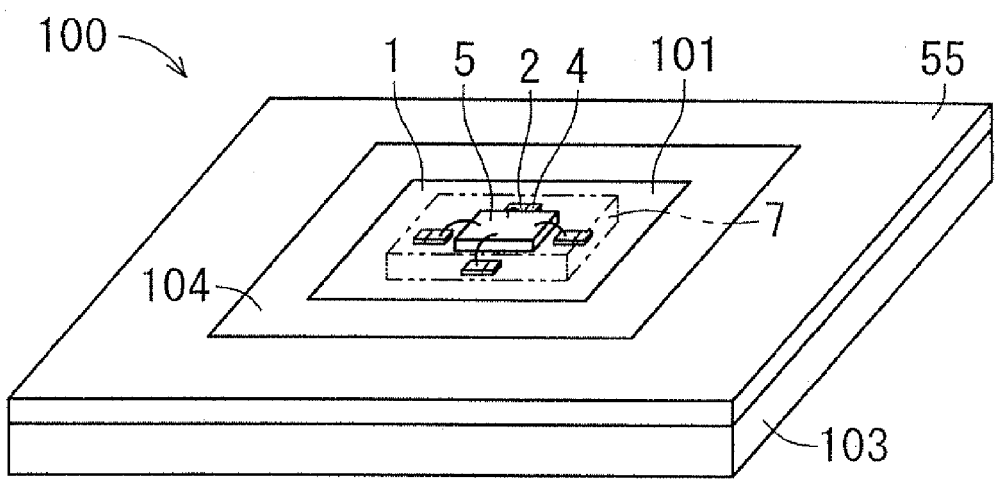
FIG. 6B is a perspective view showing the overall configuration of the high frequency module 100.

FIGS. 6A and 6B are perspective views showing the configuration of a high frequency module 100 according to an embodiment of the invention. FIG. 6A is an exploded perspective view of the high frequency module 100, and FIG. 6B is a perspective view showing the overall configuration of the high frequency module 100. The high frequency module 100 is similar to the high frequency module 50 described above, and, thus, the corresponding portions are denoted by the same reference numerals and a description thereof is omitted. The high frequency module 100 includes a circuit board 101, a second circuit board 103, the control board 55, and a cover member 104.

As in the circuit board 10 provided in the high frequency module 50 described above, the circuit board 101 has a plurality of laminated waveguides that are respectively led out to different outer side surfaces of the substrate 1. In the circuit board 101, the lead-out portions 3a of the plurality of laminated waveguides are formed on different outer side surfaces of the substrate 1. Moreover, in the circuit board 101, positioning markers 102 respectively corresponding to the lead-out portions 3a are formed on the surface of the substrate 1. With these markers, the positions where the lead-out portions 3a have been formed can be recognized from the main surface side of the substrate 1. Accordingly, when mounting the circuit board 101 on the second circuit board 103, the alignment between the lead-out portions 3a formed on the circuit board 101 and the second lead-out portions 52 of the second circuit board 103 can be achieved easily.

As in the second circuit board 51 provided in the high frequency module 50 described above, the second circuit board 103 has a recess portion that is recessed in a thickness direction thereof. In the second circuit board 103, the waveguides are led out to inner side surfaces of the recess portion. On inner peripheral surfaces of the recess portion in the second circuit board 103, the second lead-out portions 52 of the waveguides are formed. The circuit board 101 is fitted to the recess portion of the second circuit board 103 such that the lead-out portions 3a of the laminated waveguides are opposed to the second lead-out portions 52 of the waveguides.

In the high frequency module 100, choke structures 103a are formed on the second circuit board 103 side or the circuit board 101 side at the connecting portion between the lead-out portions 3a of the circuit board 101 and the second lead-out portions 52 of the second circuit board 103. In the high frequency module 100, the choke structures 103a reduce leakage of high frequency signals caused by connection between the lead-out portions 3a and the second lead-out portions 52. The size of the choke structures 103a is an integral multiple of ¼ of the wavelength $\lambda$ of a high frequency signal.

The cover member 104 is disposed on the surface of the second circuit board 103 so as to cover the boundary between the circuit board 101 and the second circuit board 103 from above in a state where the circuit board 101 is fitted to the recess portion of the second circuit board 103. The cover member 104 is, for example, a frame-shaped metal plate. Accordingly, leakage of high frequency signals at the boundary between the circuit board 101 and the second circuit board 103 can be reduced.

Next, a transmitter, a receiver, a transceiver, and a radar apparatus which are provided with the high frequency module 50 will be described.

FIG. 7 is a diagram showing the configuration of a transmitter 60 according to an embodiment of the invention. The transmitter 60 of this embodiment is provided with the high frequency module 50, and includes an oscillator 61 mounted on one surface of the circuit board 10. The oscillator 61 is connected to the waveguide line 2 and generates a high frequency signal. The transmitter 60 radiates the high frequency signal generated by the oscillator 61 which is connected to the laminated waveguide 3, from the second circuit board 51.

Figure 8:
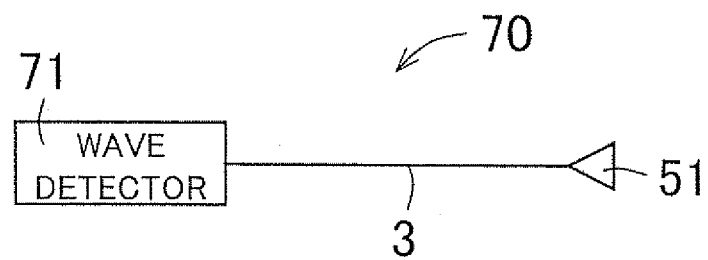
FIG. 8 is a view showing the configuration of a receiver 70 according to an embodiment of the invention.

FIG. 8 is a view showing the configuration of a receiver 70 according to an embodiment of the invention. The receiver 70 of this embodiment is provided with the high frequency module 50, and includes a wave detector 71 mounted on one surface of the circuit board 10. The wave detector 71 detects a high frequency signal captured by the second circuit board 51 which is connected to the laminated waveguide 3.

Figure 9:
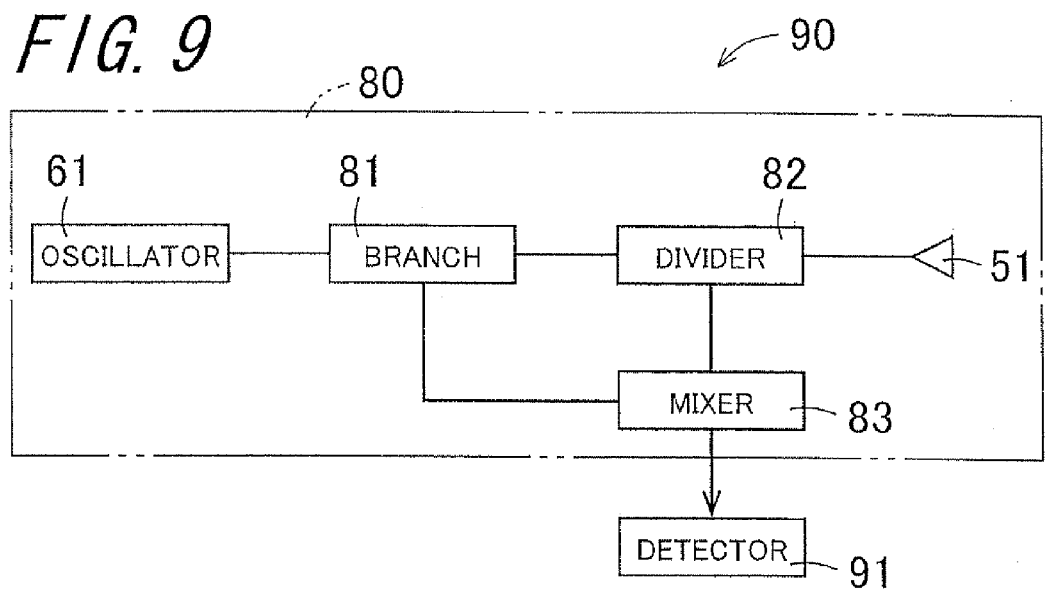
FIG. 9 is a view showing the configuration of a transceiver 80 and a radar apparatus 90 according to an embodiment of the invention.

FIG. 9 is a view showing the configuration of a transceiver 80 and a radar apparatus 90 according to an embodiment of the invention. The radar apparatus 90 of this embodiment includes the transceiver 80 provided with the high frequency module 50, and a detector 91. The detector 91 detects a distance or a relative velocity with respect to an object to be detected, based on an intermediate frequency signal from a mixer 83 provided in the transceiver 80.

The transceiver 80 of this embodiment is provided with the high frequency module 50, and includes the oscillator 61 mounted on one surface of the circuit board 10, and a branch 81. The oscillator 61 outputs a high frequency signal. The oscillator 61 is used as a high frequency element that is connected to the waveguide line 2 and inputs a high frequency signal to the waveguide line 2. The branch 81 is disposed on the waveguide line 2, and branches the high frequency signal outputted by the oscillator 61. The second circuit board 51 in the transceiver 80 radiates therefrom, via a divider 82, a part of the high frequency signal that is branched by the branch 81. Furthermore, the waveguide 51a as the antenna of the second circuit board 51 is connected to the laminated waveguide 3, and receives a high frequency signal. The transceiver 80 further includes the mixer 83. The mixer 83 mixes the remaining part of the high frequency signal that is branched by the branch 81 with the high frequency signal that is received by the antenna and transmitted through the divider 82, and outputs an intermediate frequency signal.

According to the transmitter 60, the receiver 70, the transceiver 80, and the radar apparatus 90 of this embodiment, the high frequency module 50 is provided, the oscillator 61, the wave detector 71, or the like is mounted on one surface of the circuit board 10, and the second circuit board 51 or the like for transmitting and receiving signals is connected to the circuit board 10. Accordingly, high frequency signals processed by the high frequency circuit forming portion on the circuit board 10 side can be effectively transmitted to the second circuit board 51 and radiated from the second circuit board 51, and, conversely, high frequency signals received by the second circuit board 51 can be effectively transmitted to the high frequency circuit forming portion on the circuit board 10 side. Thus, the size can be reduced, and a good transmitting and receiving performance can be realized.

Note that the transmitter 60, the receiver 70, and the transceiver 80 may be configured so as to be provided with the high frequency module 100 described above instead of the high frequency module 50.

A plurality of circuit boards 10 may be arranged on a single second circuit board 51 or 103. Furthermore, a plurality of circuit boards 10 may be arranged side by side, and a laminated waveguide 3 of one circuit board 10 and a laminated waveguide 3 of another circuit board 10 may be electromagnetically coupled to each other.

The laminated waveguides 3 of the circuit board 10 and the waveguides of the second circuit boards 51 and 103 are not limited to those that exchange high frequency signals with a high frequency element or those that function as antennas. The laminated waveguides 3 of the circuit board 10 and the waveguides of the second circuit boards 51 and 103 may be those that output input high frequency signals from another position or those that terminate input high frequency signals.

The forgoing embodiments are merely illustrative in all aspects. The scope of the invention is defined by the appended claims.

REFERENCE SIGNS LIST

1: Substrate
2: Waveguide line
3: Laminated waveguide
3a: Lead-out portion
4: Coupler
5: Semiconductor element
10, 101: Circuit board
31: Dielectric layer
32: Main conductive layer
33: Through conductor
34: Through conductor group
50, 100: High frequency module
51, 103: Second circuit board
52: Second lead-out portion
53: Recess portion
60: Transmitter
61: Oscillator
70: Receiver
71: Wave detector
80: Transceiver
81: Branch
82: Divider
83: Mixer
90: Radar apparatus
91: Detector

The invention claimed is:

1. A circuit board, comprising:
a substrate comprising a plurality of surfaces;
a waveguide line that is at least partially positioned on a first surface of the substrate, and is configured to transmit a high frequency signal; and
a laminated waveguide that is formed inside the substrate, is electromagnetically coupled to the waveguide line, and comprises a lead-out portion led out from inside the substrate to a surface other than the first surface,
wherein the laminated waveguide comprises:
a dielectric;
a pair of main conductive layers which the dielectric is sandwiched therebetween; and
a through conductor group comprising a plurality of through conductors that electrically connect the pair of main conductive layers and are arranged along a signal transmitting direction, and
wherein the lead-out portion is formed on a plurality of side surfaces of the substrate.

2. The circuit board according to claim 1, further comprising a coupling portion that electromagnetically couples the waveguide line and the laminated waveguide.

3. A waveguide structure, comprising:
at least one first circuit board comprising:
a first substrate comprising a plurality of surfaces;
a waveguide line that is at least partially positioned on a first surface of the substrate, and is configured to transmit a high frequency signal; and
a laminated waveguide that is formed inside the first substrate, is electromagnetically coupled to the waveguide line, and comprises a lead-out portion led out from inside the first substrate to a surface other than the first surface, wherein the laminated waveguide comprises a first dielectric, a pair of first main conductive layers which the first dielectric is sandwiched therebetween, a first through conductor group comprising a plurality of first through conductors that electrically connect the pair of first main conductive layers and are arranged along a signal transmitting direction, and the lead-out portion is formed on a plurality of side surfaces of the first substrate; and a second circuit board comprising:
  a second substrate; and
  a waveguide that is formed inside the second substrate and is electromagnetically coupled to the laminated waveguide of the first circuit board.

4. The waveguide structure according to claim 3, wherein the second substrate comprises, on one surface side thereof, a recess portion that accommodates at least part of the first circuit board thereinside, and
the waveguide comprises a second lead-out portion that is led out from inside the second substrate to an inner side surface of the recess portion and that is electromagnetically coupled to the lead-out portion of the first circuit board.

5. The waveguide structure according to claim 3, wherein the at least one first circuit board comprises a plurality of first circuit boards.

6. The waveguide structure according to claim 3, wherein the waveguide comprises:
  a second dielectric;
  a pair of second main conductive layers which the second dielectric is sandwiched therebetween; and
  a second through conductor group comprising a plurality of second through conductors that electrically connect the pair of second main conductive layers and are arranged along the signal transmitting direction.

7. A high frequency module, comprising:
  the waveguide structure according to claim 3; and
  a high frequency element that is electromagnetically coupled to the laminated waveguide.

8. The high frequency module according to claim 7, wherein the second circuit board further comprises an antenna that is electromagnetically coupled to the waveguide and is configured for at least one of transmission and reception of the high frequency signal.

9. A radar apparatus, comprising:
  the high frequency module according to claim 8,
    wherein the antenna comprises a transmitting antenna and a receiving antenna,
    wherein the laminated waveguide further comprises a branch configured to branch the high frequency signal into a plurality of branched signals and to output one of the plurality of branched signals to the transmitting antenna, and
    wherein the high frequency element comprises
      an output element configured to output the high frequency signal to the branch, and
      a mixer configured to mix the one of the plurality of branched signals with a received signal received by the receiving antenna to generate an intermediate frequency signal, and to output the intermediate frequency signal; and
  a detector configured to detect at least one of a distance and a relative velocity with respect to an object to be detected, based on the intermediate frequency signal from the mixer.

\* \* \* \* \*